(12) United States Patent
Shimode et al.

(10) Patent No.: US 12,422,506 B2
(45) Date of Patent: Sep. 23, 2025

(54) MAGNETO-SENSITIVE WIRE AND MANUFACTURING METHOD THEREFOR

(71) Applicant: AICHI STEEL CORPORATION, Tokai (JP)

(72) Inventors: Akihiro Shimode, Aichi-ken (JP); Shunichi Tatematsu, Aichi-ken (JP)

(73) Assignee: AICHI STEEL CORPORATION, Tokai (JP)

( * ) Notice: Subject to any disclaimer, the term of this patent is extended or adjusted under 35 U.S.C. 154(b) by 556 days.

(21) Appl. No.: 17/791,048

(22) PCT Filed: Feb. 24, 2021

(86) PCT No.: PCT/JP2021/006934
§ 371 (c)(1),
(2) Date: Jul. 6, 2022

(87) PCT Pub. No.: WO2021/192792
PCT Pub. Date: Sep. 30, 2021

(65) Prior Publication Data
US 2023/0019018 A1    Jan. 19, 2023

(30) Foreign Application Priority Data
Mar. 24, 2020  (JP) ................. 2020-052064

(51) Int. Cl.
*C22C 19/07*     (2006.01)
*C22C 45/04*     (2006.01)
(Continued)

(52) U.S. Cl.
CPC ............. *G01R 33/06* (2013.01); *C22C 19/07* (2013.01); *C22C 45/04* (2013.01); *C22F 1/10* (2013.01);
(Continued)

(58) Field of Classification Search
CPC . C22C 19/07; C22C 2202/02; C22C 2200/02; C22C 45/04; C22F 1/10;
(Continued)

(56) References Cited

U.S. PATENT DOCUMENTS 4,527,614 A    7/1985  Masumoto et al.
4,657,604 A    4/1987  Ogasawara et al.
(Continued)

FOREIGN PATENT DOCUMENTS

JP    57-79052 A    5/1982
JP    62-27540 A    2/1987
(Continued)

OTHER PUBLICATIONS

Nematov, Mahsudsho Gayratovich, et al. "Effect of mechanical stresses and annealing on the magnetic structure and the magnetic impedance of amorphous CoFeSiBCr microwires." Physics of the Solid State 60 (2018): 328-333.*
(Continued)

*Primary Examiner* — Jessee R Roe
(74) *Attorney, Agent, or Firm* — Sughrue Mion, PLLC

(57) ABSTRACT

A magneto-sensitive wire for a magnetic sensor with both measurement range expansion and environment resistance performance improvement, includes a Co-based alloy containing more Fe than a reference composition that is amorphous overall and exhibits zero magnetostriction. The Co-based alloy may have an Fe ratio (Fe/(Co+Fe+Ni)) of 6.1% to 9.5%. The Fe ratio is an atomic fraction of the Fe amount with respect to the total amount of a magnetic element group consisting of Co, Fe, and Ni. By heating an amorphous wire of a Co-based alloy at a temperate at least equal to a crystallization start temperature and lower than a crystallization end temperature, allows the magneto-sensitive wire to have a composite structure in which crystal grains are
(Continued)

dispersed in the amorphous phase. The magneto-sensitive wire's anisotropy field is, for example, 5 to 70 Oe and the stress sensitivity, indicative of magnetostriction, is −30 to 30 mOe/MPa.

13 Claims, 4 Drawing Sheets

(51) Int. Cl.
*C22F 1/10* (2006.01)
*G01R 33/06* (2006.01)
*H01F 1/10* (2006.01)
*H01F 1/153* (2006.01)

(52) U.S. Cl.
CPC ..... *H01F 1/15316* (2013.01); *H01F 1/15341* (2013.01); *C22C 2200/02* (2013.01); *C22C 2202/02* (2013.01)

(58) Field of Classification Search
CPC ......... G01R 33/063; G01R 33/06; H01F 1/10; H01F 1/15316; H01F 1/15341
See application file for complete search history.

(56) References Cited

U.S. PATENT DOCUMENTS

| | | |
|---|---|---|
| 4,781,771 A | 11/1988 | Masumoto et al. |
| 5,240,066 A | 8/1993 | Gorynin et al. |
| 8,610,427 B2 | 12/2013 | Honkura et al. |
| 11,579,212 B2 | 2/2023 | Hamada et al. |
| 2011/0080164 A1 | 4/2011 | Honkura et al. |
| 2020/0217904 A1 | 7/2020 | Hamada et al. |

FOREIGN PATENT DOCUMENTS

| | | |
|---|---|---|
| JP | 8-503891 A | 4/1996 |
| JP | 2000-164414 A | 6/2000 |
| JP | 4650591 B2 | 3/2011 |
| JP | 6428884 B1 | 11/2018 |
| WO | 93/05904 A2 | 4/1993 |
| WO | 2009/119081 A1 | 10/2009 |
| WO | 2019/049597 A1 | 3/2019 |

OTHER PUBLICATIONS

International Search Report for PCT/JP2021/006934 dated May 11, 2021.
International Preliminary Report on Patentability and Translation of the Written Opinion of the International Searching Authority in International Application No. PCT/JP2021/006934, dated Sep. 22, 2022.
First Office Action issued Feb. 26, 2025 in Chinese Patent Application No. 202180007364.0.

* cited by examiner

| Stress sensitivity (mOe/MPa) | 0 | 10 | 20 | 30 | 50 | 100 |
|---|---|---|---|---|---|---|
| Sensitivity change rate (%) | within 0.1 | −0.4 | −1.2 | −2.7 | −5 | −9 |

MAGNETO-SENSITIVE WIRE AND MANUFACTURING METHOD THEREFOR

CROSS REFERENCE TO RELATED APPLICATIONS

This application is a National Stage of International Application No. PCT/JP2021/006934 filed Feb. 24, 2021, claiming priority based on Japanese Patent Application No. 2020-052064 filed Mar. 24, 2020.

TECHNICAL FIELD

The present invention relates to a magneto-sensitive wire used for magnetic sensors and also relates to relevant techniques.

BACKGROUND ART

Magnetic sensors have been used, such as fluxgate sensors (FG sensors), Hall sensors, giant magneto-resistive sensors (GMR sensors), and magneto-impedance sensors (MI sensors). Among these, MI sensors are superior to other sensors in terms of the sensitivity, responsivity, power consumption, and other properties. Accordingly, MI sensors are being used not only in electronic compasses that measure the geomagnetism (about 50 µT) but also in mobile devices such as smartphones as well as various products in automobile fields, medical fields, etc.

With the enhanced functionality of devices equipped with MI sensors and the expansion of their applications, MI sensors are required to have an expanded measurement range that allows for operation even in an environmental magnetic field and the stability of their characteristics against external environmental variation (environment resistance performance).

MI sensors detect the magnitude of magnetization rotation as a change in impedance or a voltage. The magnetization rotation occurs in the circumferential direction of a magneto-sensitive wire (magneto-sensitive body), to which a high-frequency current or a pulse current is applied, in response to the strength of the surrounding magnetic field. The measurement range of an MI sensor correlates with how likely the magnetization rotation occurs in the magneto-sensitive wire. How likely the magnetization rotation occurs depends greatly on an anisotropic magnetic field (Hk) of the magneto-sensitive wire. When the anisotropic magnetic field is small, the magnetization rotation is likely to occur and the measurement range is narrowed. In contrast, when the anisotropic magnetic field is large, the magnetization rotation is less likely to occur and the measurement range is widened.

The conventional magneto-sensitive wire is composed of an amorphous wire that is amorphous overall (simply referred to as an "amorphous wire), and the anisotropic magnetic field has been adjusted by control of the internal stress to remain in the amorphous wire. As the internal stress becomes large, the anisotropic magnetic field also becomes large, while as the internal stress becomes small, the anisotropic magnetic field also becomes small. The internal stress has been given by tension annealing (TA) such that the amorphous wire is heated while applying tensile stress (tension) to the amorphous wire, and the internal stress has been adjusted by the conditions of the tension annealing.

The tension annealing is performed by heating a wire, to which tension is applied, in a furnace or by energizing the wire to heat it. In any case, the conventional tension annealing has been performed on the assumption that the amorphous state of the wire is maintained. Specifically, the heating temperature for the wire (such as the temperature in the furnace) has been set to a temperature lower than the crystallization temperature, or even when the heating temperature is set to a temperature equal to or higher than the crystallization temperature, heating for a very short time has been performed so that crystallization does not proceed.

PRIOR ART DOCUMENT

Patent Document

[Patent Document 1] JP6428884B

SUMMARY OF INVENTION

Technical Problem

By fundamentally reviewing the tension annealing conditions, Patent Document 1 proposes a magneto-sensitive wire composed of a composite structure in which, unlike the conventional magneto-sensitive wire, fine crystal grains (also simply referred to as "fine crystals") are precipitated in an amorphous phase. The fine crystals increase the anisotropic magnetic field of the magneto-sensitive wire and can expand the measurement range of the MI sensor.

Patent Document 1 exemplifies a Co-based alloy composed of two types of alloy compositions as an amorphous wire before heat treatment in the column of examples. That is, the two types of alloy compositions are Co—4.6Fe—11.7Si—11.6B and Co—4.7Fe—10.5Si—10.6B (composition unit: at %). In both compositions, the atomic fraction of Co and Fe (Fe/Co) is 5.9% to 6%. These Co-based alloys are designed such that the magnetostriction is substantially zero (simply referred to as "zero magnetostriction") when the whole is amorphous. However, the magnetostriction is responsive not only to the alloy composition but also to the alloy structure, and therefore the Co-based alloy in which fine crystals are precipitated by tension annealing no longer exhibits the zero magnetostriction.

Patent Document 1 ([0042]) also includes the description about magnetostriction. That is, Patent Document 1 states that the magnetostriction is controlled by the alloy composition and the heat treatment conditions and that the influence of the component composition of the amorphous phase (composition excluding crystal grains) is larger than that of the entire composition. However, Patent Document 1 only includes a specific description about the control of anisotropic magnetic field, and nothing in the document specifically describes the control of magnetostriction.

The present invention has been made in view of such circumstances and an object of the present invention is to provide a magneto-sensitive wire whose anisotropic magnetic field and magnetostriction are adjusted and relevant techniques.

Solution to Problem

As a result of intensive studies to achieve the above object, the present inventors have succeeded in obtaining a magneto-sensitive wire whose anisotropic magnetic field and magnetostriction are within desired ranges by using a wire comprising a Co-based alloy containing more Fe than that of a reference composition that exhibits zero magnetostriction. Developing this achievement, the present inventors have accomplished the present invention, which will be described below.

«Magneto-Sensitive Wire»

(1) The present invention provides a magneto-sensitive wire comprising a Co-based alloy that contains Fe, the Co-based alloy containing more Fe than that of a reference composition that is amorphous overall and exhibits zero magnetostriction, and the Co-based alloy comprising a composite structure in which crystal grains are dispersed in an amorphous phase.

(2) According to the magneto-sensitive wire of the present invention, the magnetostriction can be controlled to near zero while increasing the anisotropic magnetic field (Hk). By increasing the anisotropic magnetic field, the measurement range of the magnetic sensor using the magneto-sensitive wire can be expanded. By controlling the magnetostriction, the environment resistance performance of the magnetic sensor is ensured.

As an example of the environment performance of a magnetic sensor, there is temperature dependence of the sensitivity. Specifically, as the temperature around the magnetic sensor varies, thermal stress may act on the magneto-sensitive wire fixed with a resin or the like. When the magnetostriction of the magneto-sensitive wire is large, the magnetic characteristics of the magneto-sensitive wire change due to the thermal stress, and the sensitivity of the magnetic sensor may also change. In other words, if the magnetostriction of the magneto-sensitive wire is within a predetermined range near zero, the magnetic sensor can stably exhibit the desired performance even when the environment (such as temperature) fluctuates.

The magneto-sensitive wire of the present invention increases its anisotropic magnetic field not only by the residual internal stress but also by the appearance (precipitation) of fine crystal phases (crystal grains) in the amorphous phase. The anisotropic magnetic field thus developed is stable even in a high temperature environment. When the magneto-sensitive wire of the present invention is used, therefore, the measurement range of the magnetic sensor is also stable against the environmental fluctuations (such as temperature changes).

«Manufacturing Method for Magneto-Sensitive Wire»

(1) The present invention can also be perceived as a manufacturing method for a magneto-sensitive wire. For example, the present invention may be perceived as a manufacturing method comprising a heat treatment step of heating an amorphous wire comprising a Co-based alloy that contains more Fe than that of the reference composition as described above at a specific temperature equal to or higher than a crystallization start temperature and lower than a crystallization end temperature, wherein the above-described magneto-sensitive wire is obtained. The heat treatment step is performed, for example, by a tension annealing step that is carried out while applying a tensile stress to the amorphous wire.

(2) When an amorphous wire containing more Fe than that of an alloy composition that exhibits zero magnetostriction is heated at a temperature equal to or higher than the crystallization start temperature for a predetermined time, a magneto-sensitive wire is obtained in which fine crystal grains (fine crystals) having Fe as the nuclei are precipitated in the amorphous phase.

The fine crystals pin the magnetization rotation of spin (in particular, the rotation in the circumferential direction). The fine crystals (crystalline phases) have a higher density than that of the amorphous phase and generate an internal stress (compressive stress) in the contraction direction due to the density difference in the amorphous phase. The anisotropic magnetic field of the magneto-sensitive wire can thus be increased.

In addition, the magnetostriction of a magnetic material responds sensitively to its structure (or composition and structure) and changes. In the amorphous phase, Fe makes the magnetostriction to the positive side while Co (or Ni) makes the magnetostriction to the negative side. In the amorphous phase, the positive/negative of magnetostriction and the absolute value of magnetostriction are almost determined by the composition fraction of Fe, Co, and Ni (magnetic element group).

When crystal grains having Fe as the nuclei precipitate from the amorphous phase, the amount (concentration) of Fe in the amorphous phase decreases. This allows the magnetostriction of the amorphous Co-based alloy which is a soft magnetic material (simply referred to as "magnetostriction of the magneto-sensitive wire") to change, for example, from the positive side to the negative side regardless of whether the magnetostriction is positive or negative or whether its absolute value is large or small. Therefore, by adjusting the Fe amount and the heat treatment conditions, it is also possible to make the magnetostriction of the magneto-sensitive wire close to the zero magnetostriction.

Thus, the magnetostriction of the magneto-sensitive wire can change in accordance with the increase in the anisotropic magnetic field due to the precipitation of crystal grains, but the form of change differs depending on the Fe amount (Fe ratio). Specifically, in a range in which the anisotropic magnetic field is relatively small, the magnetostriction of the magneto-sensitive wire tends to decrease from the positive side to the negative side. On the other hand, in a range in which the anisotropic magnetic field is relatively large, the magnetostriction of the magneto-sensitive wire tends to be approximately constant (saturated) or increase from the negative side to the positive side. Such a tendency is considered to be due to the influence of the precipitation of fine crystals and the structural relaxation of the amorphous phase depending on the Fe amount and the heat treatment conditions.

The crystallization start and end temperatures of the amorphous wire can vary depending on the Fe ratio, and it is therefore preferred to adjust the specific temperature in accordance with the Fe ratio.

«Element/Sensor»

The present invention can also be perceived as an element or a sensor in which the above-described magneto-sensitive wire is used. For example, the present invention may be perceived as a magneto-impedance element (MI element) that includes the magneto-sensitive wire and a detection coil wound around the magneto-sensitive wire, a magneto-impedance sensor (MI sensor) that includes the MI element, or other similar devices.

«Others»

(1) The "magneto-sensitive wire" of the present invention is composed of a composite structure in which crystal grains are dispersed in the amorphous phase. The crystal grains may contain crystal grains that do not have Fe as the nuclei. Even when the crystal grains have Fe as the nuclei, the existence form of Fe (such as compound or solid solution), Fe concentration, or the like is not limited.

(2) Magnetostriction (magnetic strain) is a phenomenon in which a shape change (strain) occurs due to the application of a magnetic field. The zero magnetostriction as used in the present specification refers to a case in which the absolute value of the saturated magnetostriction (magnetostriction constant/λs) is $10^{-6}$ or less.

Magnetostriction includes positive magnetostriction (magnetostriction coefficient>0) and negative magnetostriction (magnetostriction coefficient<0) with zero magnetostriction as the boundary. Positive magnetostriction means that the magnetic material (magneto-sensitive body or wire) expands by applying a magnetic field while negative magnetostriction means that the magnetic material contracts by applying a magnetic field.

The measurement of magnetostriction in a general scheme is conducted by measuring the dimensional change of a sample when a magnetic field is applied with a strain gauge or the like that is directly attached to the sample. However, it is difficult to directly measure the magnetostriction of an ultrafine soft magnetic wire. It is therefore preferred to use the stress sensitivity as an alternative index of magnetostriction. The stress sensitivity is a rate of change in magnetic characteristics with respect to the stress applied to the magnetic material. Specifically, the stress sensitivity is defined as a rate of change (gradient) of the anisotropic magnetic field (Hk) with respect to the tensile stress applied in the longitudinal direction of the wire.

FIG. 3 illustrates the relationships between the stress sensitivity and the magnetostriction. As found from FIG. 3, when the magnetostriction is positive (λs>0), the stress sensitivity is negative, while when the magnetostriction is negative (λs<0), the stress sensitivity is positive. When the stress sensitivity is within ±10 mOe/MPa (when the absolute value is 10 mOe/MPa or less), this state may be considered as the above-described zero magnetostriction.

(3) The reference composition is an alloy composition when the Co-based alloy has an amorphous structure overall and exhibits zero magnetostriction. As described above, the positive/negative of magnetostriction is determined by the composition fraction of the magnetic element group (Fe, Co, and Ni), and particularly when the Fe ratio (=Fe/(Co+Fe+Ni)) is 5.9% to 6%, the zero magnetostriction is exhibited.

The increase in the Fe amount with respect to the reference composition is adjusted by the amount of other elements with respect to the reference composition. For example, when adjusted within the magnetic element group (Co, Fe, and Ni), the increase in Fe is adjusted as a decrease in Co and/or Ni based on the reference composition. Unless otherwise stated, the alloy composition as referred to in the present specification is an atomic fraction (at %). In the present specification, the case in which the Fe composition is larger than that of the reference composition or the Fe concentration in the crystal grains is larger than that in the mother phase (amorphous phase) will be referred to as "Fe rich" as appropriate.

(4) The "crystal grains" as referred to in the present specification are usually very fine and have a size within a range in which the crystal grains can be observed at least with a transmission electron microscope (TEM). The grain diameter (maximum length observed with a TEM image) is, for example, about 1 to 100 nm in an embodiment, about 5 to 70 nm in another embodiment, or about 10 to 50 nm in a further embodiment.

It suffices that the "amorphous (phase)" as referred to in the present specification is at least in an amorphous state to such an extent that the crystals cannot be observed with TEM.

(5) The "crystallization start temperature" and "crystallization end temperature" as referred to in the present specification are determined, respectively, as a first (heat generation) peak temperature (Tx1: primary crystallization temperature) and a subsequent next (heat generation) peak temperature (Tx2: secondary crystallization temperature) that appear when an amorphous wire is measured by differential scanning calorimetry (DSC). The crystallization start temperature is usually a temperature at which the crystal grains begin to appear (precipitate) from the amorphous phase. The crystallization end temperature is usually a temperature at which the entire amorphous phase crystallizes and the appearance of the crystal grains stops.

(6) Unless otherwise stated, a numerical range "x to y" as referred to in the present specification includes the lower limit x and the upper limit y. Any numerical value included in various numerical values or numerical ranges described in the present specification may be selected or extracted as a new lower or upper limit, and any numerical range such as "a to b" can thereby be newly provided using such a new lower or upper limit. Unless otherwise stated, "x to y nm" as referred to in the present specification means x nm to y nm. The same applies to other unit systems (such as mOe/MPa).

EMBODIMENTS FOR CARRYING OUT THE INVENTION

Figure 1A:
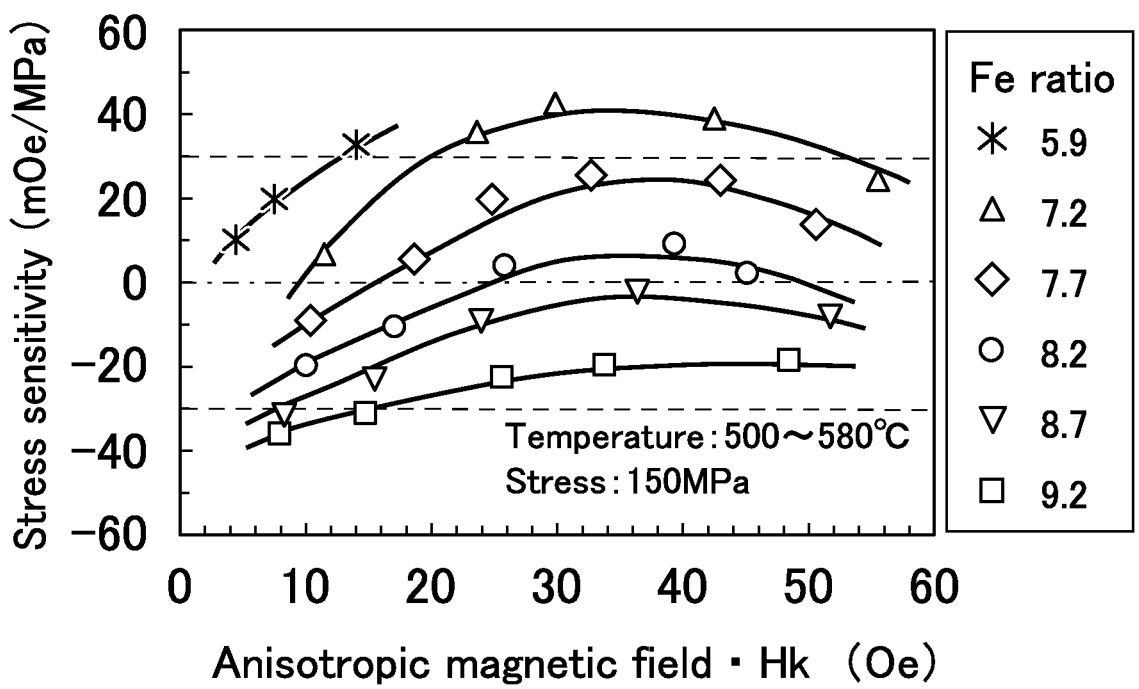
FIG. 1A is a graph illustrating the relationship between the anisotropic magnetic field (Hk) and the stress sensitivity for each Fe ratio of magneto-sensitive wires.

One or more features freely selected from the present specification can be added to the above-described features of the present invention. The content described in the present specification corresponds not only to the magneto-sensitive wire of the present invention but also to a manufacturing method for the magneto-sensitive wire and relevant techniques, as appropriate. Methodological features can even be features regarding a product.

«Co-Based Alloy»

(1) The Co-based alloy is composed of Co and one or more alloy elements (alloy element group) and can constitute an amorphous soft magnetic alloy. First, Co, which is the main component (the balance), is contained, for example, in an amount of more than 50 at % in an embodiment, 60 at % or more in another embodiment, 65 at % or more in still another embodiment, or 70 at % or more in a further embodiment with respect to the Co-based alloy as a whole. Suffice it to say that Co may be contained in an amount of 85 at % or less in an embodiment, 80 at % or less in another embodiment, or 75 at % or less in a further embodiment with respect to the Co-based alloy as a whole.

Unless otherwise stated, the alloy composition as referred to in the present specification is represented by an atomic fraction (atomic ratio/stoichiometric ratio). Representation of the alloy composition includes a fraction to the Co-based alloy as a whole (100 at %) and a fraction to the total amount of the magnetic element group (Co+Fe+Ni) as a whole (100 at %). Unless otherwise stated, the fraction to the Co-based alloy as a whole (100 at %) is referred to.

Fe is an essential element of the Co-based alloy, but Ni is not necessarily an essential element of the Co-based alloy. The "total amount of the magnetic element group" as referred to in the present specification is the total amount of Co and Fe or the total amount of Co, Fe, and Ni. In the present specification, regardless of the presence or absence of Ni, the total amount of the magnetic element group is indicated as "Co+Fe+Ni" as appropriate.

The total amount of the magnetic element group is, for example, 65 to 85 at % in an embodiment, 70 to 80 at % in another embodiment, or 72 to 78 at % in a further embodiment with respect to the Co-based alloy as a whole.

When Ni is contained, Ni is contained, for example, in an amount of 0.1 to 3.5 at % in an embodiment, 1 to 3 at % in another embodiment, or 1.5 to 2.5 at % in a further embodiment with respect to the total amount of the magnetic element group as a whole (100 at %). With respect to the Co-based alloy as a whole (100 at %), Ni is contained, for example, in an amount of 0.1 to 2.7 at % in an embodiment, 0.7 to 2.3 at % in another embodiment, or 1.2 to 1.8 at % in a further embodiment, depending on the ratio of the magnetic element group to the Co-based alloy as a whole.

(2) Fe may be contained, for example, in an amount of 6.1 to 9.5 at % in an embodiment, 7 to 9 at % in another embodiment, 7.5 to 8.8 at % in still another embodiment, or 8 to 8.5 at % in a further embodiment with respect to the total amount of the magnetic element group as a whole (100 at %). In the present specification, the atomic fraction [Fe/(Co+Fe+Ni)] of the Fe amount to the total amount of the magnetic element group as a whole is particularly referred to as an "Fe ratio," and the above atomic fraction is simply indicated as a percentage (%). With respect to the Co-based alloy as a whole (100 at %), Fe may be contained, for example, in an amount of 4.5 to 7.2 at % in an embodiment, 5.2 to 6.8 at % in another embodiment, 5.6 to 6.6 at % in still another embodiment, or 6 to 6.4 at % in a further embodiment, depending on the ratio of the magnetic element group to the Co-based alloy as a whole.

Fe forms the product nuclei of crystal grains that appear (precipitate) from the amorphous phase. Fe tends to slightly raise the crystallization start temperature and slightly narrow the specific temperature range (crystallization start temperature to crystallization end temperature). If the amount of Fe is unduly small, the precipitation amount of fine crystals will decrease, and the effect of increasing the anisotropic magnetic field cannot be sufficiently obtained. If the amount of Fe is unduly large, the entire Co-based alloy is likely to crystallize, leading to an increase in the coercive force, and the magnetostriction of the magneto-sensitive wire becomes stable on the positive side.

(3) The Co-based alloy may contain Si and/or B. Si and B, which are light elements, can be involved in the formation of an amorphous Co-based alloy and the appearance of crystal grains. If the amount of Si and/or B is unduly large, the anisotropic magnetic field tends to change suddenly with respect to the treatment temperature.

The total of them (Si+B) is contained, for example, in an amount of 15 to 33 at % in an embodiment, 20 to 28 at % in another embodiment, or 22 to 26 at % in a further embodiment with respect to the Co-based alloy as a whole. Only one of Si and B may be contained. When both Si and B are contained, one of them may be contained in an amount of 30 to 70 at % in an embodiment, 40 to 60 at % in another embodiment, or 45 to 55 at % in a further embodiment with respect to the total amount of Si and B (100 at %).

(4) The Co-based alloy may further contain Mo, Nb, Zr, W, Cr, Ti, V, etc. These elements can contribute to the formation of an amorphous Co-based alloy. These elements are contained, for example, in an amount of 0.5 to 4 at % in an embodiment or 1 to 3 at % in another embodiment as the total with respect to the Co-based alloy as a whole. When only Mo is used, it may be contained, for example, in an amount of 0.1 to 2.3 at % in an embodiment or 0.8 to 1.8 at % in another embodiment with respect to the Co-based alloy as a whole.

«Composite Structure»

When a wire (amorphous wire) composed of an amorphous phase as a whole is subjected to appropriate heat treatment (such as tension annealing), a magneto-sensitive wire composed of a composite structure in which crystal grains are dispersed in the amorphous phase is obtained. The crystal grains are fine and are observed with TEM as previously described. The arithmetic average value (average diameter) of the particle diameters (maximum lengths) of crystal grains observed in the field of view is, for example, 1 to 150 nm in an embodiment, 5 to 70 nm in another embodiment, or 10 to 50 nm in a further embodiment. The coarsening of crystal grains causes an increase in the coercive force (increase in the hysteresis) and the like.

The particle number density of crystal grains in the composite structure is, for example, 5.5 to 10 ($\times 10^{-6}/nm^3$) in an embodiment or 6 to 9 ($\times 10^{-6}/nm^3$) in another embodiment. If the particle number density is unduly low, a sufficient anisotropic magnetic field cannot be obtained. An unduly high particle number density causes a decrease in the sensitivity of the magnetic sensor and an increase in the hysteresis. The particle number density is also obtained by image-processing the observed image with analysis software attached to the TEM.

«Manufacturing Method»

(1) Amorphous Wire

The amorphous wire can be manufactured through various methods. Examples of typical methods of manufacturing amorphous wires include the modified Tailor method (references: WO93/5904 or JPH8-503891A, etc.) and the in-rotating-liquid spinning method (references: JPS57-79052A, etc.). The amorphous wire is drawn to a desired wire diameter as appropriate before the heat treatment step.

(2) Heat Treatment Step

The magneto-sensitive wire composed of a composite structure is obtained, for example, by heat-treating an amorphous wire. The heat treatment temperature (specific temperature: T) may be adjusted between the crystallization start temperature ($Tx1$) and the crystallization end temperature ($Tx2$) ($Tx1 \leq T < Tx2$) in accordance with the desired anisotropic magnetic field and magnetostriction. If the specific temperature is lower than $Tx1$, adjustment of the anisotropic magnetic field and magnetostriction will be difficult. If the specific temperature is higher than $Tx2$, this will lead to an increase in the coercive force of the magneto-sensitive wire or deterioration of the sensitivity of the magnetic sensor.

The specific temperature may also be, for example, equal to or higher than a first temperature ($T1$) at which the magneto-sensitive wire having an anisotropic magnetic field (Hk) of 5 Oe in an embodiment or 10 Oe in another embodiment is obtained (Tx1≤T1≤T). Additionally or alternatively, the specific temperature may be equal to or lower than a second temperature (T2) at which the magneto-sensitive wire having an anisotropic magnetic field of 60 Oe in an embodiment or 50 Oe in another embodiment is obtained (T≤T2<Tx2). When the amorphous wire is heated in a furnace, the specific temperature (T) is the atmosphere temperature in the furnace.

Depending on the component composition and wire diameter of the amorphous wire and other factors, the treatment time is, for example, 0.5 to 15 seconds in an embodiment, 1 to 10 seconds in another embodiment, or 2 to 5 seconds in a further embodiment. An unduly short treatment time may cause insufficient appearance of the crystal grains, while an unduly long treatment time may cause the crystal grains to grow and become coarse. The heat treatment may be performed in an air atmosphere or otherwise in an inert gas atmosphere or a vacuum atmosphere.

The heat treatment step may be an annealing step performed without applying tensile stress (external stress) to the amorphous wire or may also be a tension annealing step performed while applying tensile stress to the amorphous wire. When the tension annealing (TA) is performed, in addition to the internal stress due to the composite structure, the internal stress due to the external stress is additively or synergistically introduced into the magneto-sensitive wire. The amorphous wire may be not only elastically deformed but also plastically deformed due to the tensile stress, provided that the amorphous wire does not break.

«Magneto-Sensitive Wire»

The magneto-sensitive wire can exhibit an anisotropic magnetic field and magnetostriction (stress sensitivity) in accordance with the specs of the magnetic sensor or the like, for example, by adjusting the above-described Fe ratio and heat treatment conditions. The magnetostriction may be substantially zero magnetostriction or may also be within a predetermined range suitable for the specs.

The anisotropic magnetic field is, for example, 5 to 70 Oe in an embodiment, 10 to 60 Oe in another embodiment, or 20 to 50 Oe in a further embodiment. The stress sensitivity is, for example, −30 to 30 mOe/MPa in an embodiment, −20 to 20 mOe/MPa in another embodiment, −10 to 10 mOe/MPa in still another embodiment, −5 to 5 mOe/MPa in yet another embodiment, or −2 to 2 mOe/MPa in a further embodiment.

The cross section of the magneto-sensitive wire is usually circular. The wire diameter is, for example, 1 to 150 μm in an embodiment, 3 to 80 μm in another embodiment, or 5 to 30 μm in a further embodiment. If the wire diameter is unduly small, the sensitivity of the magnetic sensor will be lowered. If the wire diameter is unduly large, strict management of the cooling rate for forming an amorphous magneto-sensitive wire will be required.

«Applications»

The magneto-sensitive wire of the present invention can be used for various magnetic sensors. For example, the magneto-sensitive wire of the present invention is suitable for the magneto-sensitive body of an MI sensor that is excellent in the responsivity, sensitivity, power consumption, and other properties, in particular the magneto-sensitive body of an MI sensor having a wide magnetic field measurement range.

EXAMPLES

Amorphous wires composed of Co-based alloys having different Fe ratios were heat-treated (tension-annealed) to manufacture a plurality of magneto-sensitive wires. For these magneto-sensitive wires, measurement of the magnetic characteristics (anisotropic magnetic field and stress sensitivity) and observation of the metallographic structures were conducted. In addition, the environment resistance performance of the MI sensors (magnetic sensors) equipped with the magneto-sensitive wires was evaluated. The present invention will be described in more detail below with reference to such specific examples.

First Example

«Making of Samples»
(1) Amorphous Wires

Raw materials were arc-melted to manufacture amorphous wires (wire diameter: about 125 μm) composed of Co-based alloys having different Fe ratios by the in-rotating-liquid spinning method. The amorphous wires were drawn and washed to obtain amorphous wires having a wire diameter of 18 For the wire drawing, an HSS-21 type wire drawing machine available from Saikawa Co., LTD. was used. The washing was performed with ethanol.

The alloy composition of a Co-based alloy was set to any of the following one reference composition example or compositions in which only the contents of Fe and Co were different from those of the one reference composition example. In each Co-based alloy, the contents of Ni, Si, B, and Mo and the total amount of the magnetic element group (Co+Fe+Ni) (75.2 at %) were set constant with respect to the Co-based alloy as a whole.

Reference composition: $(Co_{0.922}Fe_{0.059}Ni_{0.019})_{75.2}(Si_{0.51}B_{0.49})_{23.5}Mo_{1.3} \leftrightarrow Co_{69.3}Fe_{4.5}Ni_{1.4}Si_{12}B_{11.5}Mo_{1.3}$ (at %)

The Fe content was changed in a range of 5.9 to 9.2 at % with respect to the total amount of the magnetic element group (Co+Fe+Ni) as a whole (100 at %). In other words, the Fe content is 4.4 to 6.9 at % with respect to the Co-based alloy as a whole. Thus, a plurality of amorphous wires composed of Co-based alloys having different Fe ratios in the range of 5.9 to 9.2% was prepared. The Co-based alloy having the above-described reference composition has an Fe ratio of 5.9%. As confirmed by the X-ray diffraction method, the entire structure of each wire was amorphous (phase).

(2) Heat Treatment Step

Each wire was subjected to continuous heat treatment (tension annealing) by winding the wire and passing it through a heating furnace provided in mid-course while applying tension to the wire. The treatment conditions at that time were as follows.

The treatment conditions were set to include the applied tensile stress σ=150 MPa, the passing time in the heating furnace (time in the furnace): 3 seconds, the length of the heating furnace to pass through: 0.52 m, and the treatment atmosphere: in the air. The atmosphere temperature (treatment temperature/specific temperature) in the heating furnace to pass through was variously changed in a range of 500° C. to 580° C. for each of the wires having different Fe ratios.

«Measurement»
(1) Anisotropic Magnetic Field

The anisotropic magnetic field (Hk) of each of the wires having different alloy compositions (Fe ratios) and heat treatment conditions (treatment temperatures) was measured with a vibrating sample magnetometer (available from Toei Scientific Industrial Co., Ltd., PV-M10-5).

(2) Stress Sensitivity

For each wire, the stress sensitivity as an index of the magnetostriction was measured. Specifically, when a magnetic field (0 to 50 Oe) was applied in the longitudinal direction of the wire while stress (0 to 300 MPa) was applied by a load-variable type dancer equipped with a strain gauge type load cell in the longitudinal direction of the wire, the change in inductance occurring in the wire was measured with an LCR meter. The inductance was converted into an anisotropic magnetic field to obtain the stress sensitivity of each wire.

Figure 1B:
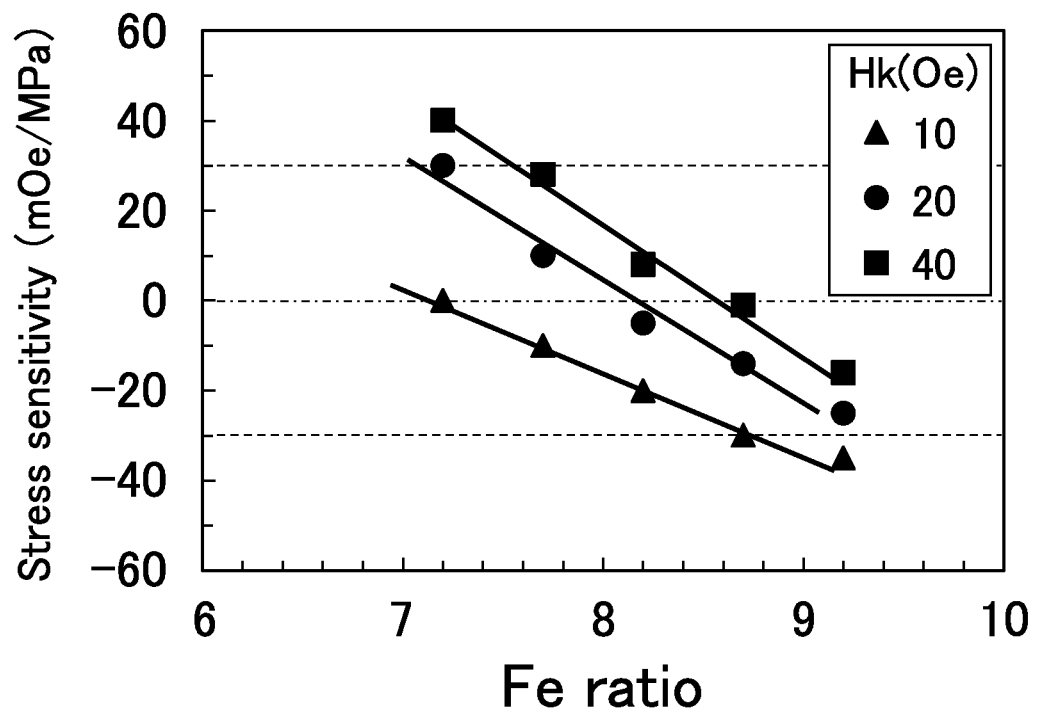
FIG. 1B is a graph illustrating the relationship between the Fe ratio and the stress sensitivity for each Hk.

The relationships between the Fe ratio and anisotropic magnetic field and the stress sensitivity of the wires (magneto-sensitive wires) obtained by heat-treating the amorphous wires are collectively illustrated in FIGS. 1A and 1B.

«Observation»

Figure 1C:
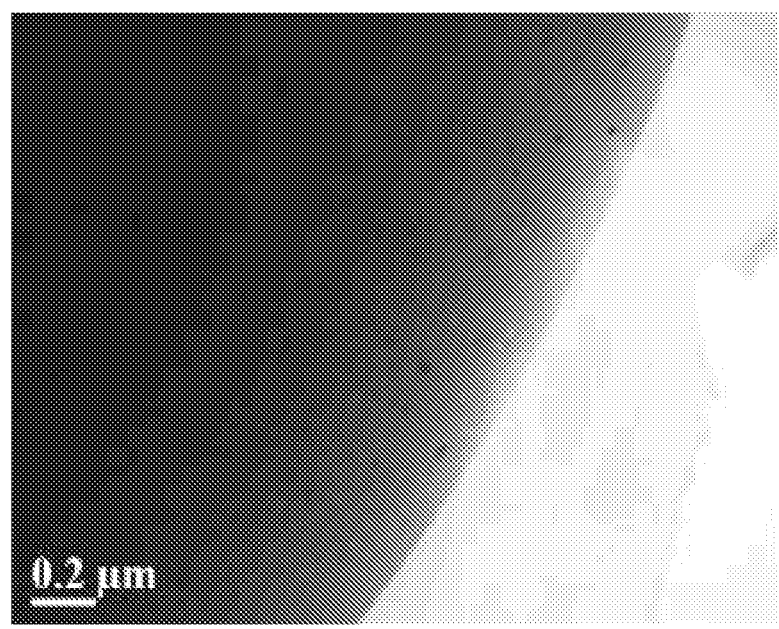
FIG. 1C is a bright field (BF) image of a cross section of a magneto-sensitive wire having an Fe ratio of 8.2% as observed with a high resolution transmission electron microscope (HR-TEM).

(1) The cross section of each heat-treated wire was observed with a high resolution transmission electron microscope (HR-TEM: available from JEOL Ltd., JEM-2100F). As an example, a TEM image (BF image) of a wire having an Fe ratio of 8.2%, an anisotropic magnetic field of 39 Oe, and a stress sensitivity of 9 mOe/MPa is illustrated in FIG. 1C. Granular black and white dots seen in the TEM image represent the fine crystals. The difference in color (black and white) in the TEM image indicates the difference in crystal orientation.

(2) From the measurement results of the differential scanning calorimetry (DSC) separately performed for the amorphous wire having the reference composition (Fe ratio 5.9%), the crystallization start temperature (Tx1) was specified as 514° C. and the crystallization end temperature (Tx2) was specified as 553° C. In the amorphous wires having higher Fe ratios than that of the reference composition, it has been observed that, depending on the Fe ratio, the crystallization start temperature tends to be slightly higher and the temperature range (crystallization start temperature to crystallization end temperature) tends to be slightly narrower. For example, when the Fe ratio was 9.2%, the crystallization start temperature (Tx1) was 517° C. and the crystallization end temperature (Tx2) was 548° C.

«Evaluation»

(1) Anisotropic Magnetic Field and Stress Sensitivity (Magnetostriction)

As apparent from FIGS. 1A and 1B, it has been found that the anisotropic magnetic field and stress sensitivity of a magneto-sensitive wire can be widely adjusted by adjusting the Fe ratio and the heat treatment conditions. Specifically, for example, the anisotropic magnetic field was able to be adjusted in a range of 5 to 60 Oe in an example or 10 to 55 Oe in another example while allowing the magnetostriction to be near zero.

As apparent from FIG. 1A, when an amorphous wire having an Fe ratio larger than that of the reference composition (Fe ratio 5.9%) was heat-treated, the stress sensitivity (magnetostriction) tended to converge almost to near zero within a range (e.g., 35 Oe or more in an example or 40 Oe or more in another example) in which the anisotropic magnetic field was relatively large.

Moreover, when an amorphous wire having an Fe ratio within a predetermined range (e.g., an Fe ratio of 7.5% to 8.5%) was heat-treated, there was a point at which the stress sensitivity (magnetostriction) became almost zero (point at which the magnetostriction transitioned from positive to negative) within a range (e.g., 35 Oe or less in an example or 25 Oe or less in another example) in which the anisotropic magnetic field was relatively small.

(2) Complex Structure

Figure 1D:
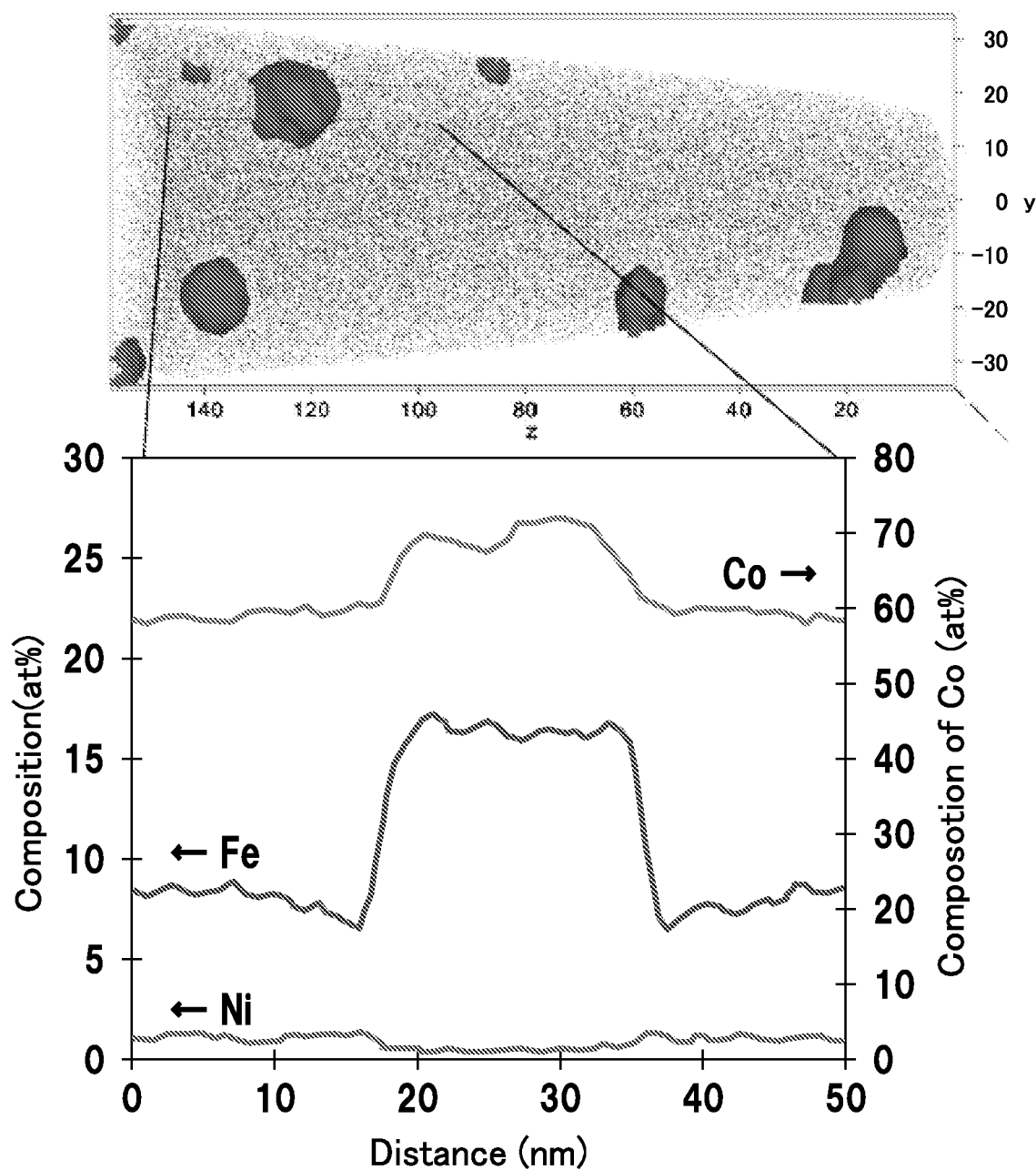
FIG. 1D is a distribution chart of magnetic element concentrations obtained by analyzing the vicinities of fine crystals with a three-dimensional atom probe.

As shown in FIG. 1C, it has also been confirmed from the TEM image of observing the wire after the heat treatment that a composite structure is obtained in which a large number of fine crystal grains appear almost uniformly in the amorphous phase. The size (maximum length) of the crystal grains was about 50 nm at the maximum, which was very fine. It has been confirmed that Fe is contained in the crystal grains, as illustrated in FIG. 1D, by a three-dimensional atom probe (available from AMTEK, LEAP4000XSi).

Second Example (1) MI Sensors

MI sensors equipped with the above-described magneto-sensitive wires were produced. Six types of magneto-sensitive wires having stress sensitivities of 0 to 100 mOe/MPa were prepared by adjusting the Fe ratio and the heat treatment conditions (see FIG. 2).

Production of each MI sensor was conducted based on JP4650591B or the specs of AMI306 (commercially available product) available from AICHI STEEL CORPORATION.

(2) Environmental Test

Figures 2, 3:
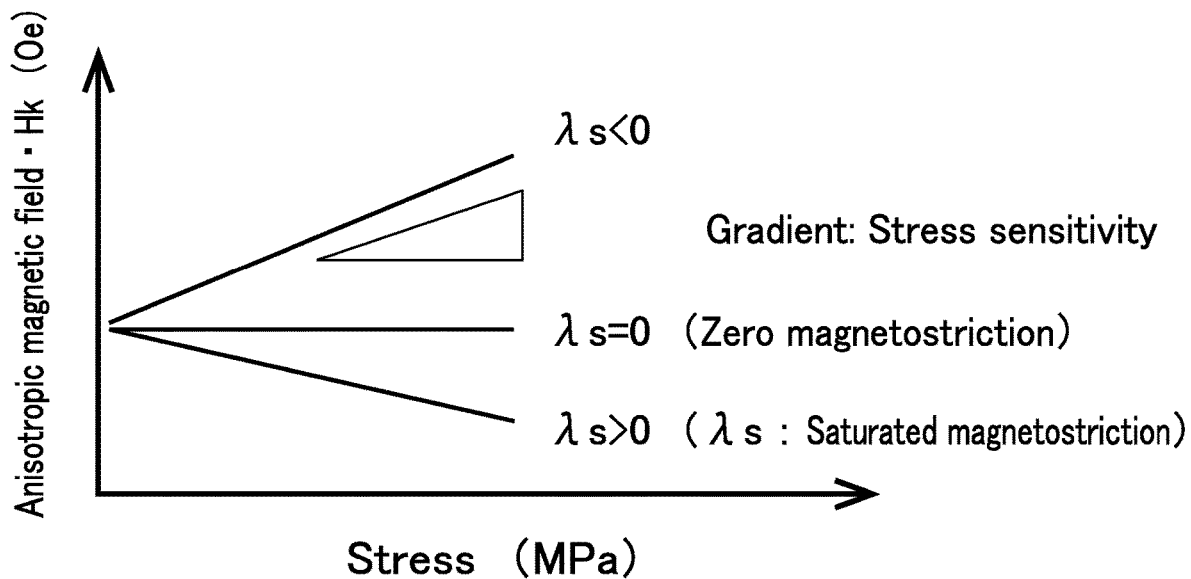
FIG. 2 is a table illustrating the relationship between the stress sensitivity of a magneto-sensitive wire and the sensitivity change rate of an MI sensor using the magneto-sensitive wire.
FIG. 3 is a schematic diagram illustrating the relationship between the magnetostriction (λs) and the stress sensitivity.

Each MI sensor was subjected to an environmental test. The environmental test was carried out through placing an MI sensor in a treatment chamber having a temperature of 80° C. and a humidity of 85% and holding it for 100 hours. Before and after this high temperature and high humidity test, the sensitivity of each MI sensor was measured. The sensitivity change rate determined by dividing the sensitivity difference before and after the test by the sensitivity before the test was obtained for each MI sensor (magneto-sensitive wire). FIG. 2 illustrates a list in which the stress sensitivity of a magneto-sensitive wire and the sensitivity change rate of an MI sensor are associated with each other.

(3) Evaluation

As apparent from FIG. 2, it has been found that the sensitivity change rate of an MI sensor can be suppressed even under an environmental variation by using a magneto-sensitive wire having a small stress sensitivity (magnetostriction). Specifically, for example, when the stress sensitivity of a magneto-sensitive wire was within a range of ±30 mOe/MPa, the sensitivity decrease of the MI sensor was able to be less than 3%. As the environmental test, instead of the above-described high temperature and high humidity test, a gas phase temperature cycle test, a liquid phase thermal shock test, or the like may be performed. In any case, similar results can be obtained.

From the above, according to the magneto-sensitive wire of the present invention, desired anisotropic magnetic field and magnetostriction (stress sensitivity) are achieved. Moreover, by using this magneto-sensitive wire, it is possible to obtain a magnetic sensor that achieves both the expansion of the measurement range and the improvement in the environment resistance performance.

The invention claimed is:

1. A magneto-sensitive wire comprising a Co-based alloy that contains Fe, the Co-based alloy containing more Fe than that of a reference composition that is amorphous overall and exhibits zero magnetostriction, the Co-based alloy comprising a composite structure in which crystal grains are dispersed in an amorphous phase, and the Co-based alloy has an Fe ratio (Fe/(Co+Fe+Ni)) of 6.1% to 9.5%, wherein the Fe ratio is an atomic fraction of an Fe amount with respect to a total amount of a magnetic element group consisting of Co, Fe, and Ni, and wherein the Co-based alloy contains 0.1 to 3.5 at % of Ni with respect to the total amount of the magnetic element group as a whole.

2. The magneto-sensitive wire according to claim 1, wherein the Co-based alloy contains 65 to 85 at % of the magnetic element group in total with respect to the Co-based alloy as a whole.

3. The magneto-sensitive wire according to claim 1, wherein the Co-based alloy further contains 15 to 33 at % of Si and/or B in total with respect to the Co-based alloy as a whole.

4. The magneto-sensitive wire according to claim 1, wherein the Co-based alloy further contains 0.1 to 2.3 at % of Mo with respect to the Co-based alloy as a whole.

5. The magneto-sensitive wire according to claim 1, wherein the magneto-sensitive wire has an anisotropic magnetic field of 5 to 70 Oe and a stress sensitivity of −30 to 30 mOe/MPa.

6. A manufacturing method comprising a heat treatment step of heating an amorphous wire comprising a Co-based alloy at a specific temperature equal to or higher than a crystallization start temperature and lower than a crystallization end temperature, the Co-based alloy containing more Fe than that of a reference composition that is amorphous overall and exhibits zero magnetostriction, wherein the magneto-sensitive wire according to claim 1 is obtained.

7. The manufacturing method for a magneto-sensitive wire according to claim 6, wherein the heat treatment step is a tension annealing step performed while applying a tensile stress to the amorphous wire.

8. A magneto-sensitive wire comprising a Co-based alloy that contains Fe, the Co-based alloy containing more Fe than that of a reference composition that is amorphous overall and exhibits zero magnetostriction, the Co-based alloy comprising a composite structure in which crystal grains are dispersed in an amorphous phase, and the Co-based alloy has an Fe ratio (Fe/(Co+Fe+Ni)) of 6.1% to 9.5%, wherein the Fe ratio is an atomic fraction of an Fe amount with respect to a total amount of a magnetic element group consisting of Co, Fe, and Ni, and wherein the Co-based alloy further contains 0.1 to 2.3 at % of Mo with respect to the Co-based alloy as a whole.

9. The magneto-sensitive wire according to claim 8, wherein the Co-based alloy contains 65 to 85 at % of the magnetic element group in total with respect to the Co-based alloy as a whole.

10. The magneto-sensitive wire according to claim 8, wherein the Co-based alloy further contains 15 to 33 at % of Si and/or B in total with respect to the Co-based alloy as a whole.

11. A manufacturing method comprising a heat treatment step of heating an amorphous wire comprising a Co-based alloy at a specific temperature equal to or higher than a crystallization start temperature and lower than a crystallization end temperature, the Co-based alloy containing more Fe than that of a reference composition that is amorphous overall and exhibits zero magnetostriction, wherein the magneto-sensitive wire according to claim 10 is obtained.

12. The manufacturing method for a magneto-sensitive wire according to claim 11, wherein the heat treatment step is a tension annealing step performed while applying a tensile stress to the amorphous wire.

13. The magneto-sensitive wire according to claim 8, wherein the magneto-sensitive wire has an anisotropic magnetic field of 5 to 70 Oe and a stress sensitivity of −30 to 30 mOe/MPa.

* * * * *